United States Patent
Saeki et al.

(10) Patent No.: US 10,121,978 B2
(45) Date of Patent: Nov. 6, 2018

(54) DISPLAY DEVICE

(71) Applicant: Japan Display Inc., Tokyo (JP)

(72) Inventors: Takashi Saeki, Tokyo (JP); Naohisa Ando, Tokyo (JP)

(73) Assignee: Japan Display Inc., Tokyo (JP)

( * ) Notice: Subject to any disclaimer, the term of this patent is extended or adjusted under 35 U.S.C. 154(b) by 0 days.

(21) Appl. No.: 15/702,793

(22) Filed: Sep. 13, 2017

(65) Prior Publication Data

US 2018/0006250 A1 Jan. 4, 2018

Related U.S. Application Data

(63) Continuation of application No. 15/082,047, filed on Mar. 28, 2016, now Pat. No. 9,793,502.

(30) Foreign Application Priority Data

Mar. 30, 2015 (JP) .................................. 2015-069491

(51) Int. Cl.
*H01L 51/00* (2006.01)
*H01L 27/32* (2006.01)

(52) U.S. Cl.
CPC ...... *H01L 51/0097* (2013.01); *H01L 27/3276* (2013.01); *H05K 999/99* (2013.01); *H01L 2251/5338* (2013.01); *Y02E 10/549* (2013.01)

(58) Field of Classification Search
CPC ............. H01L 51/0097; H01L 27/3276; H01L 2251/5338
See application file for complete search history.

(56) References Cited

U.S. PATENT DOCUMENTS

| 9,379,355 | B1 | 6/2016 | Lee |
| 2013/0002133 | A1 | 1/2013 | Jin et al. |
| 2013/0081756 | A1 | 4/2013 | Franklin et al. |
| 2014/0126228 | A1 | 5/2014 | Lee et al. |
| 2014/0217382 | A1 | 8/2014 | Kwon et al. |
| 2014/0247405 | A1 | 9/2014 | Jin et al. |
| 2015/0021570 | A1 | 1/2015 | Kim et al. |
| 2015/0036300 | A1* | 2/2015 | Park ...................... H05K 1/147 361/749 |

(Continued)

FOREIGN PATENT DOCUMENTS

| CN | 104347678 A | 2/2015 |
| JP | S60-107622 A | 6/1985 |

(Continued)

OTHER PUBLICATIONS

Korean Office Action dated Mar. 21, 2017 for corresponding Korean Application No. 10-2016-0035905.

(Continued)

*Primary Examiner* — Karen Kusumakar
(74) *Attorney, Agent, or Firm* — Typha IP LLC

(57) ABSTRACT

A display device includes: an insulating substrate having flexibility and including a bent portion that is bent at 90 degrees or more outside a display area provided with an image display function; and a spacer disposed inside the bent portion and including a curved area around which the bent portion is wrapped and a plane area facing the insulating substrate, wherein the insulating substrate includes a flat portion adjacent to the bent portion and provided so as to face the plane area.

9 Claims, 9 Drawing Sheets

(56) References Cited

U.S. PATENT DOCUMENTS

2016/0087024 A1    3/2016  Son et al.

FOREIGN PATENT DOCUMENTS

| JP | 2013-015835 A | 1/2013 |
|----|---------------|--------|
| KR | 10-2014-0108827 A | 9/2014 |
| KR | 10-2015-0014713 A | 2/2015 |

OTHER PUBLICATIONS

Chinese Office Action dated Mar. 29, 2018 for corresponding Chinese Patent Application No. 201610188810.3.
Japanese Office Action dated Apr. 24, 2018 for corresponding JP Patent Application No. 2015-069491.

* cited by examiner

DISPLAY DEVICE

CROSS-REFERENCE TO RELATED APPLICATIONS

This application is a continuation of U.S. patent application Ser. No. 15/082,047 filed on Mar. 28, 2016. Further, this application claims priority from Japanese application JP2015-069491 filed on Mar. 30, 2015, the contents of which are hereby incorporated by reference into this application.

BACKGROUND OF THE INVENTION

1. Field of the Invention

The present invention relates to a display device.

2. Description of the Related Art

In a display device such as an organic electroluminescent (EL) display device, an image may be displayed by controlling a self-emitting element such as an organic light-emitting diode (OLED) using a switching element such as a transistor. A display panel such as an organic EL panel that displays an image may be configured using a flexible substrate, and may have a curved shape.

JP 2013-015835 A discloses a flexible display panel including a first display area, a second display area located on a curved surface, and a folded non-display area.

SUMMARY OF THE INVENTION

The display device may include a display area and a picture-frame area. Here, when the width of the picture-frame area is narrowed by folding the substrate, it is necessary to prevent the disconnection of wiring lines provided in the picture-frame area.

It is therefore an object of the invention to provide a display device in which the risk of disconnection is reduced even when a narrower picture-frame is achieved by folding a substrate.

A display device according to an aspect of the invention includes: an insulating substrate having flexibility and including a bent portion that is bent at 90 degrees or more outside a display area provided with an image display function; and a spacer disposed inside the bent portion and including a curved area around which the bent portion is wrapped and a plane area facing the insulating substrate, wherein the insulating substrate includes a flat portion adjacent to the bent portion and provided so as to face the plane area.

DETAILED DESCRIPTION OF THE INVENTION

Figure 1:
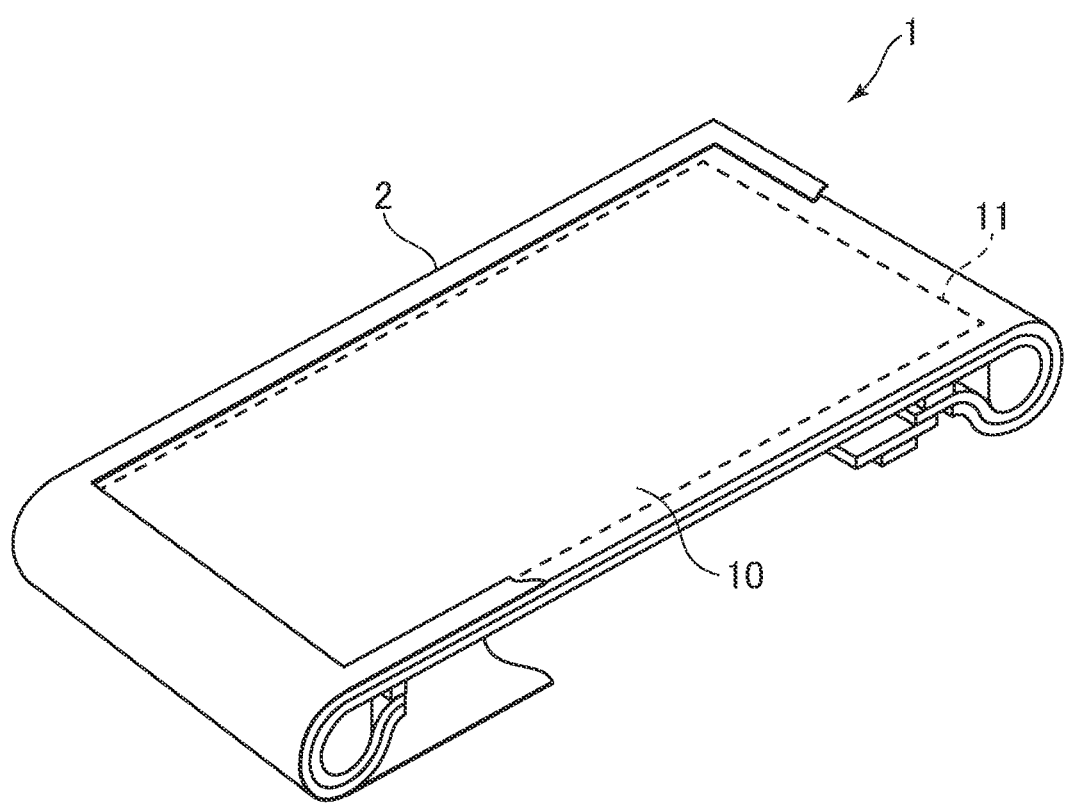
FIG. 1 is a perspective view of a display device according to a first embodiment of the invention.

Hereinafter, embodiments of the invention will be described with reference to the drawings. The disclosure is illustrative only. Appropriate modifications that will readily occur to those skilled in the art and fall within the gist of the invention are of course included in the scope of the invention. For more clarity of description, the width, thickness, shape, and the like of each part may be schematically represented in the drawings, compared to those in practicing aspects of the invention. However, they are illustrative only, and do not limit the interpretation of the invention. Moreover, in the specification and the drawings, elements similar to those described in relation to a previous drawing are denoted by the same reference numerals and signs, and a detailed description may be appropriately omitted.

First Embodiment

FIG. 1 is a perspective view showing a display device 1 according to a first embodiment of the invention. The display device 1 is composed of a display panel 10 fixed inside a frame 2. In FIG. 1, the frame 2 is shown partly cut away to illustrate the display panel 10 accommodated therein. The display panel 10 is fixed in a state where the edge portions thereof are folded back as will be described later.

Figure 2:
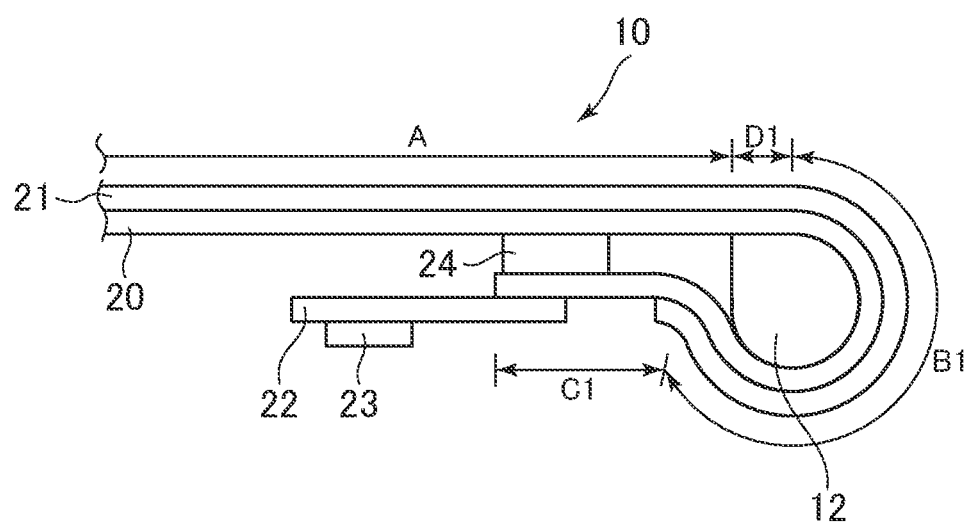
FIG. 2 is a side view of a display panel according to the first embodiment of the invention.

FIG. 2 is a side view of the display panel 10 according to the first embodiment of the invention. The display panel 10 has flexibility, and is composed of a thin film transistor (TFT) substrate 20 as an insulating substrate, a counter substrate 21 provided on the TFT substrate 20 and having flexibility, and a flexible printed circuit (FPC) board 22 connected to an edge portion of the TFT substrate 20. Here, the TFT substrate 20 and the counter substrate 21 may be formed of polyimide or the like. A driver integrated circuit (IC) 23 is mounted on the flexible printed circuit board 22. Other electronic circuits may be mounted on the flexible printed circuit board 22.

The counter substrate 21 is disposed on a viewing side of a display area 11 (display portion A), and the TFT substrate 20 is disposed on the side opposite to the viewing side. The TFT substrate 20 as an insulating substrate and the counter substrate 21 have a bent portion B1 that is bent at 90 degrees or more outside the display area 11 (the display portion A). If the bent portion B1 is bent at 90 degrees or more, a picture-frame area is narrowed when viewed from the viewing side. Here, the bend angle of the bent portion B1 may be 180 degrees or more. In the display panel 10 according to the embodiment, the bent portion B1 has a bend angle of 180 degrees.

A spacer 12 that prevents the disconnection of wiring lines in the bent portion B1 is provided inside the bent portion B1. The spacer 12 includes a curved area 32 (shown in FIG. 4) that is disposed inside the bent portion B1 and around which the bent portion B1 is wrapped, a first plane area 31 facing the TFT substrate 20, and a second plane area (shown in FIG. 4). The TFT substrate 20 includes, corresponding to the first plane area 31 of the spacer 12, a flat portion D1 adjacent to the bent portion B1 and provided so as to face the first plane area 31.

In the display panel 10 according to the embodiment, the disconnection of wiring lines provided in the TFT substrate 20 is prevented by limiting the curvature radius of the TFT substrate 20 as an insulating substrate with the spacer 12. Moreover, since the spacer 12 includes the first plane area 31, the spacer 12 is prevented from causing a shift in its position due to rotation, and also, the flat portion D1 is provided in the TFT substrate 20 and thus the flatness of the display portion A is retained.

The TFT substrate 20 as an insulating substrate includes a folded-back portion C1 that is folded back by the bent portion B1 on the side of the display area 11 (the display portion A) opposite to the viewing side. The flexible printed circuit board 22 as an electronic component is provided on the outer surface of the folded-back portion C1, and the driver IC 23 as an electronic component is mounted on the outer surface of the flexible printed circuit board 22.

The display panel 10 according to the embodiment is provided with the folded-back portion C1 with the bent portion B1 having a bend angle of 180 degrees, and thus, the flexible printed circuit board 22 and an electronic circuit such as the driver IC 23 can be disposed on the side of the display area 11 opposite to the viewing side. Therefore, an electronic component necessary for driving the display device 1 can be disposed without widening the picture-frame area.

The folded-back portion C1 is bonded at the inner surface thereof onto a surface of the display area (the display portion A) on the side opposite to the viewing side. In the display panel 10 according to the embodiment, the TFT substrate 20 is bonded using an adhesive 24.

In the display panel 10 according to the embodiment, the folded-back portion C1 is bonded with the adhesive 24, so that the opening of the bent portion B1 is prevented, and thus that the bend with a curvature radius defined by the spacer 12 is retained. Therefore, the display panel 10 can be easily assembled into the frame 2.

A bent portion B2, a folded-back portion C2, and a flat portion D2 of the display panel 10, which are located on the side opposite to the flexible printed circuit board 22, have configurations similar to the bent portion B1, the folded-back portion C1, and the flat portion D1 located on the flexible printed circuit board 22 side. In the display panel 10 according to the embodiment, a configuration has been illustrated in which the TFT substrate 20 and the counter substrate 21 are folded by providing the spacer 12 at two of edge portions located on the four sides. However, the bent portion may be provided at one of the edge portions located on the four sides, or may be provided at three or more edge portions. Moreover, even when the display panel has a shape other than a quadrilateral, a narrower picture-frame can be achieved, while preventing the disconnection of wiring lines, by providing the bent portion outside the display area 11 and providing the spacer inside the bent portion.

Figure 3:
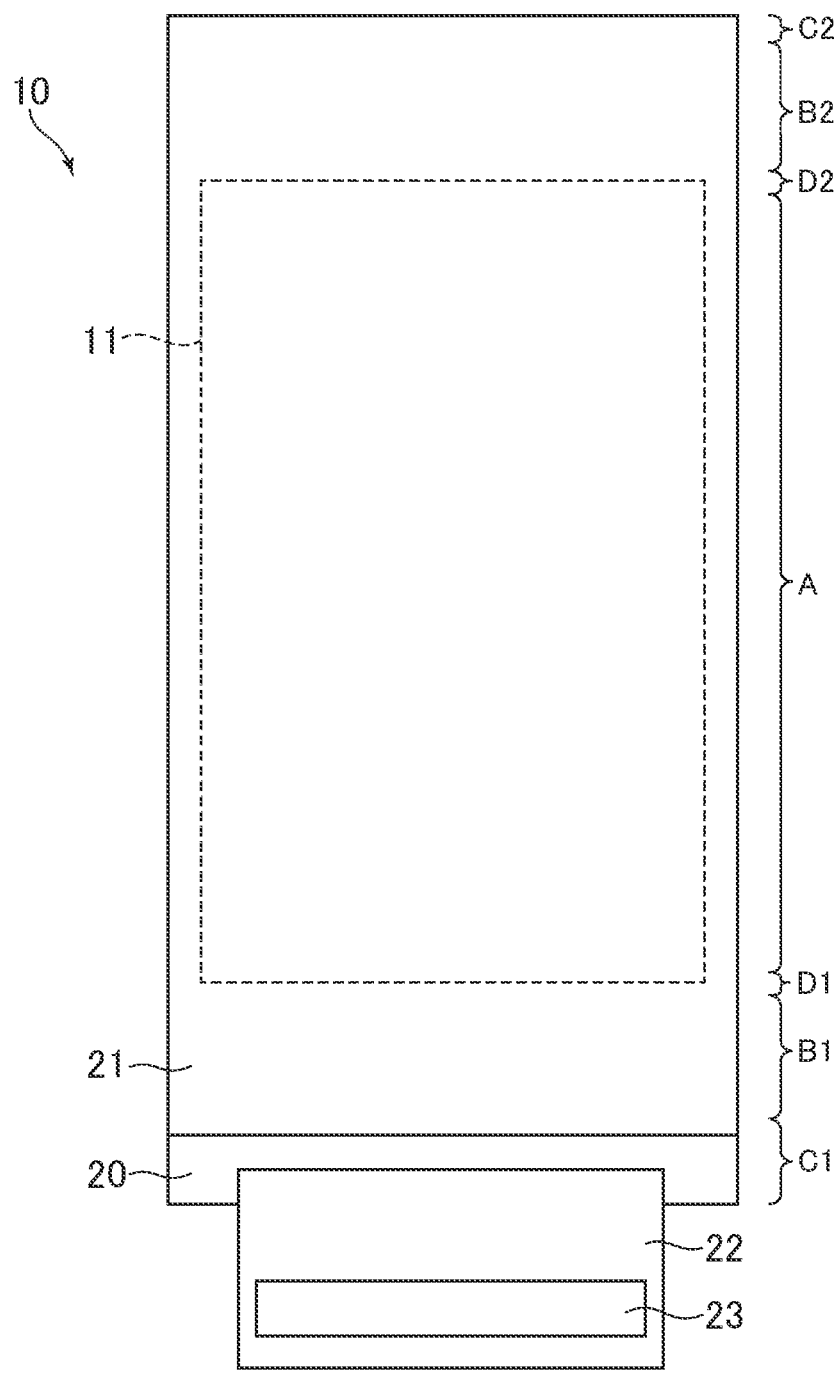
FIG. 3 is a plan view of the display panel according to the first embodiment of the invention.

FIG. 3 is a plan view of the display panel 10 according to the first embodiment of the invention. FIG. 3 represents the display panel 10 before being assembled into the frame 2. The display panel 10 includes the display area 11 (area surrounded by the broken line in FIG. 3) provided with an image display function. The display area 11 includes pixels that emit lights of RGB colors and each of which is controlled for its light emission by a control signal output from the driver IC 23, so that full-color display is performed. The display panel 10 according to the embodiment is an organic electroluminescent (EL) display panel, and each of the pixels is composed of an organic light-emitting diode and a control transistor. The display panel 10 is not limited to an organic EL display panel, and may be, for example, a quantum dot display panel.

The display panel 10 includes the display portion A including the display area 11, the flat portions D1 and D2 adjacent to the display portion A, the bent portion B1 adjacent to the flat portion D1, the bent portion B2 adjacent to the flat portion D2, the folded-back portion C1 adjacent to the bent portion B1, and the folded-back portion C2 adjacent to the bent portion B2. In the display panel 10 according to the embodiment, the TFT substrate 20 and the counter substrate 21 are formed to be greater than the display area 11 in the long-side direction, the flexible printed circuit board 22 is provided in an area of the TFT substrate 20 outside the display area 11, and in addition, a common electrode wiring line and the like are provided in the outside area. Therefore, when the display panel 10 is assembled into the frame 2 while remaining in the state shown in FIG. 3, the picture-frame area is widened in the long-side direction. In the display device 1 according to the embodiment, therefore, the TFT substrate 20 and the counter substrate 21 are folded to achieve a narrower picture-frame.

Figure 4:
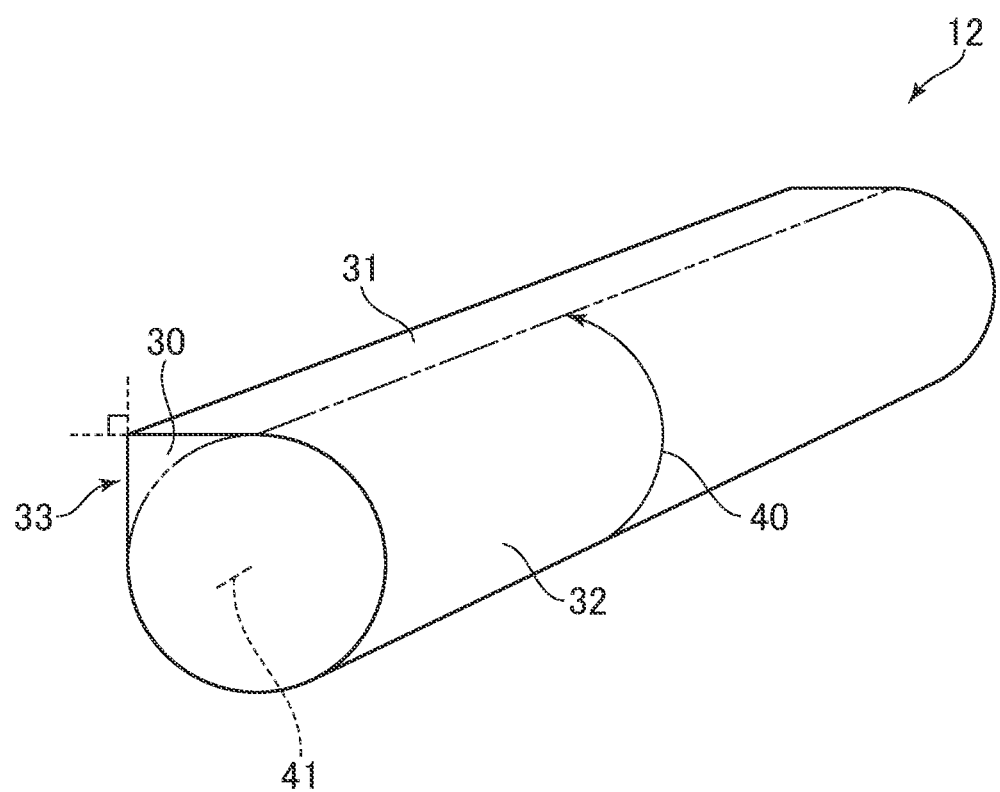
FIG. 4 is a perspective view of a spacer according to the first embodiment of the invention.

FIG. 4 is a perspective view of the spacer 12 according to the first embodiment of the invention. In the drawing, a border line between the first plane area 31 and the curved area 32 and an axis 41 are virtually shown. The curved area 32 of the spacer 12 has the shape of a surface of revolution obtained by rotating a straight line parallel to the axis 41 about the axis 41. The shape of a surface of revolution is the shape of a surface of a circular cylinder. In the spacer 12 according to the embodiment, the shape of a surface of revolution is a shape obtained by rotating a straight line parallel to the axis 41 at a position of a 0.5 mm radius relative to the axis 41. However, the radius of the curved area 32 measured from the axis 41 may be a value other than 0.5 mm. The curvature radius of the curved area 32 defines the curvature radius of wiring lines provided in the TFT substrate 20. The curvature radius of the curved area 32 is minimized to such an extent that the wiring lines provided in the TFT substrate 20 are not disconnected, so that the thickness of the display panel 10 can be suppressed.

The first plane area 31 and the second plane area 33 are provided in directions away from the curved area 32 and tangential to an arc 40 that is drawn by the curved area 32 when the spacer 12 is viewed in cross-section in the direction of the axis 41a. The arc 40 is an arc about the axis 41. The first plane area 31 and the second plane area 33 are plane areas extending in the direction of the axis 41 and in the directions tangential to the arc 40.

The spacer 12 includes a projecting portion 30 that projects in a direction away from the curved area 32 and tangential to the arc 40. The first plane area 31 and the second plane area 33 are surfaces of the projecting portion 30. Since the spacer 12 includes the projecting portion 30, even when the TFT substrate 20 as an insulating substrate has flexibility, the spacer 12 is prevented from rotating inside the bent portion and also the insulating substrate is reinforced.

The projecting portion 30 includes the first plane area 31 extending from one end of the arc 40 in the direction tangential to the arc 40, and the second plane area 33 extending from the other end of the arc 40 in the direction tangential to the arc 40. The first plane area 31 is provided at an angle of 90 degrees or less with respect to the second plane area 33. In the spacer 12 according to the embodiment, the first plane area 31 is provided at a right angle, that is, an angle of 90 degrees, with respect to the second plane area 33. In this manner, since the first plane area 31 and the second plane area 33 are provided at an angle of 90 degrees or less, a plane area having an area sufficient to support the insulating substrate is provided on the spacer.

Figure 5:
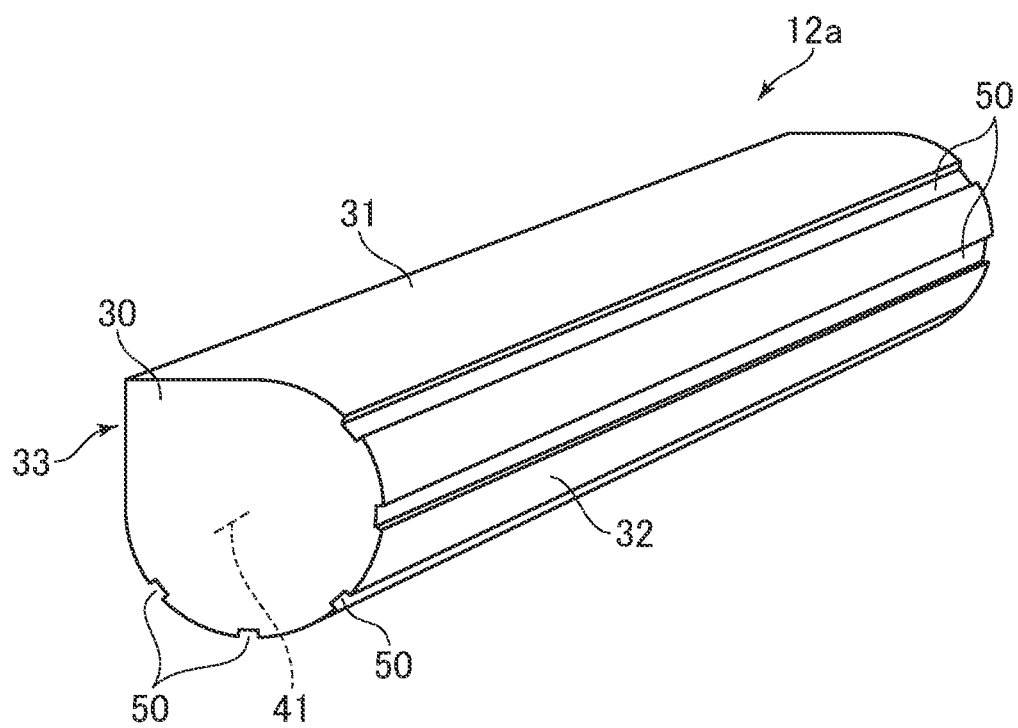
FIG. 5 is a perspective view of a spacer according to a first modified example.

FIG. 5 is a perspective view of a spacer 12a according to a first modified example. The spacer 12a according to the modified example includes, in the curved area 32, first groove portions 50 that are provided so as to extend in a direction parallel to the axis 41. A display device according to the modified example has configurations similar to those of the display device 1 according to the first embodiment, excepting that the spacer 12a includes the first groove portions 50. In the example shown in FIG. 5, five first groove portions 50 are provided, but the number of first groove portions 50 is not limited to this example, and it is sufficient that the number thereof is one or more.

The spacer 12a according to the modified example is bonded to the bent portion B1 with an adhesive member provided in the first groove portion 50. This prevents the spacer 12a from rotating inside the bent portion B1, and also prevents the spacer 12a from causing a shift in its position. Further, the folded-back state is retained without bonding the folded-back portion C1 with the adhesive 24.

Figure 6:
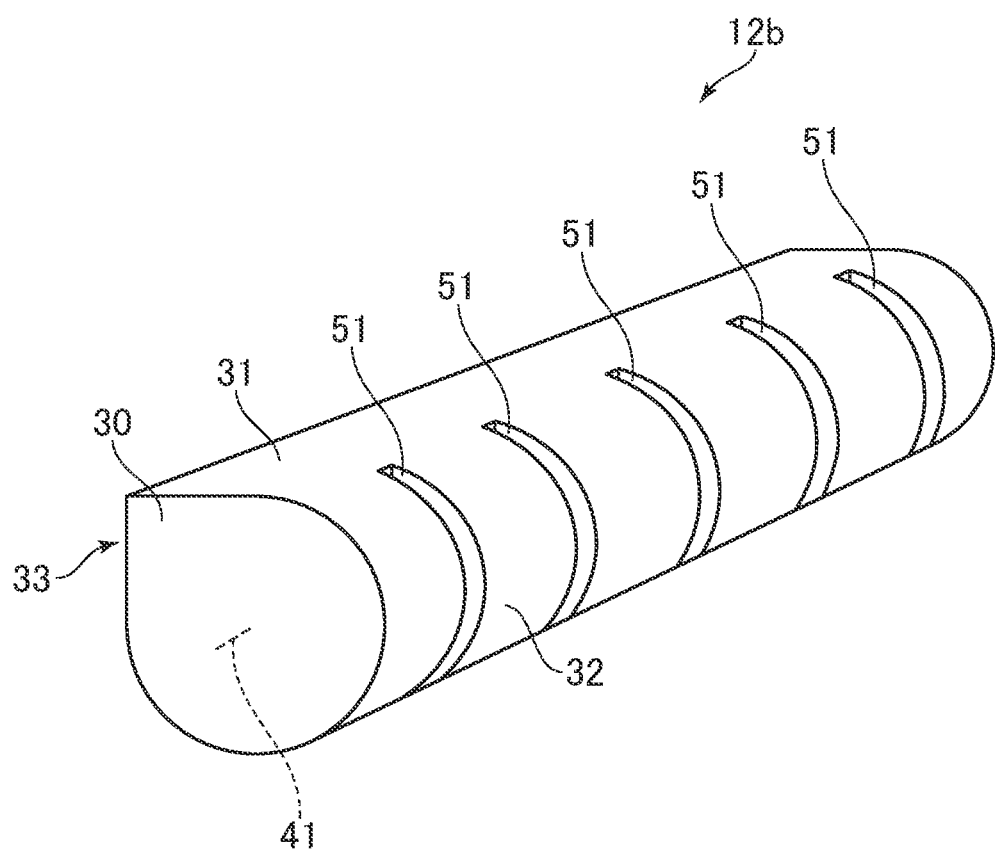
FIG. 6 is a perspective view of a spacer according to a second modified example.

FIG. 6 is a perspective view of a spacer 12b according to a second modified example. The spacer 12b according to the modified example includes second groove portions 51 that are provided along an arc that is drawn by the curved area 32 when the spacer 12b is viewed in cross-section in the direction of the axis 41. A display device according to the modified example has configurations similar to those of the display device 1 according to the first embodiment, excepting that the spacer 12b includes the second groove portions 51. In the example shown in FIG. 6, five second groove portions 51 are provided, but the number of second groove portions 51 is not limited to this example, and it is sufficient that the number thereof is one or more.

The spacer 12b according to the modified example is bonded to the bent portion B1 with an adhesive member provided in the second groove portion 51. This prevents the spacer 12b from rotating inside the bent portion B1, and also prevents the spacer 12a from causing a shift in its position. Further, the folded-back state is retained without bonding the folded-back portion C1 with the adhesive 24.

Second Embodiment

Figure 7:
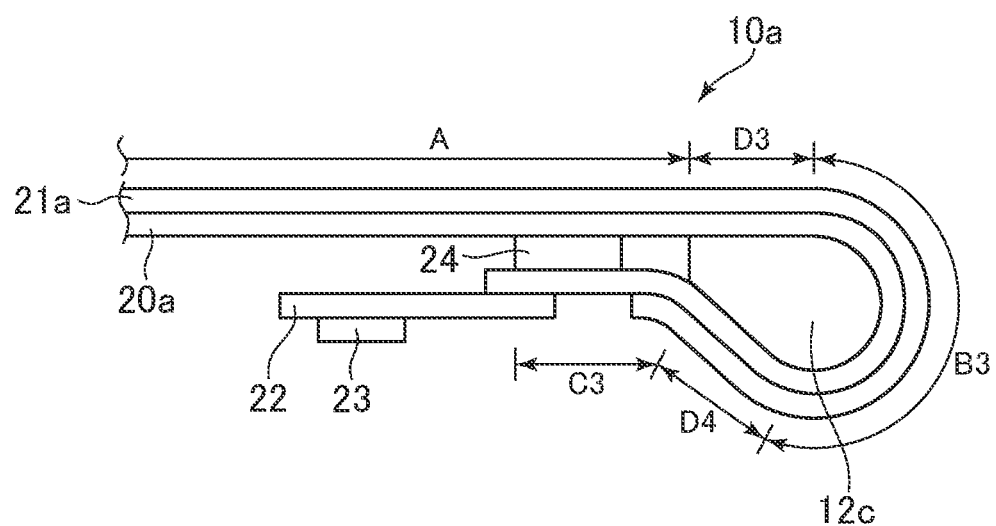
FIG. 7 is a side view of a display panel according to a second embodiment of the invention.

FIG. 7 is a side view of a display panel 10a according to a second embodiment of the invention. In a spacer 12c according to the embodiment, the size of a projecting portion 30a (shown in FIG. 8) is greater than the projecting portion 30 of the spacer 12 according to the first embodiment. As to other configurations, a display device according to the second embodiment has configurations similar to those of the display device 1 according to the first embodiment.

The display panel 10a according to the embodiment includes, in addition to the display portion A, a first flat portion D3, a bent portion B3, a second flat portion D4, and a folded-back portion C3. Although, in FIG. 7, an edge portion of the display panel 10a on the side where the flexible printed circuit board 22 is provided is illustrated, the display panel 10a according to the embodiment has similar configurations also at an edge portion on the side opposite to the side where the flexible printed circuit board 22 is provided.

Figure 8:
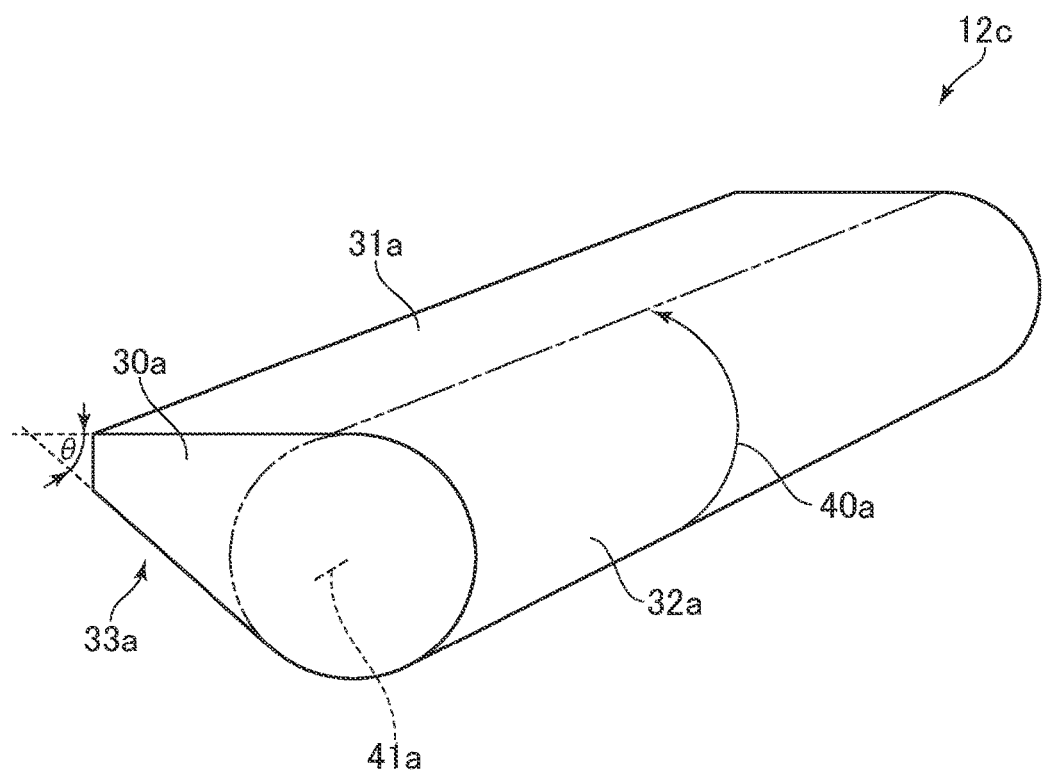
FIG. 8 is a perspective view of a spacer according to the second embodiment of the invention.

The projecting portion 30a of the spacer 12c includes a first plane area 31a and a second plane area 33a (shown in FIG. 8). A TFT substrate 20a according to the embodiment includes, corresponding to these plane areas, the first flat portion D3 facing the first plane area 31a and adjacent to the bent portion B3, and the second flat portion D4 facing the second plane area 33a and adjacent to the bent portion B3.

FIG. 8 is a perspective view of the spacer 12c according to the second embodiment of the invention. In the drawing, a border line between the first plane area 31a and a curved area 32a and an axis 41a are virtually shown. The curved area 32a of the spacer 12c has the shape of a surface of revolution obtained by rotating a straight line parallel to the axis 41a about the axis 41a. The shape of a surface of revolution is the shape of a surface of a circular cylinder. In the spacer 12c according to the embodiment, the shape of a surface of revolution is a shape obtained by rotating a straight line parallel to the axis 41a at a position of a 0.5 mm radius relative to the axis 41a. However, the radius of the curved area 32a measured from the axis 41a may be a value other than 0.5 mm. The curvature radius of the curved area 32a defines the curvature radius of wiring lines provided in the TFT substrate 20a. The curvature radius of the curved area 32a is minimized to such an extent that the wiring lines provided in the TFT substrate 20a are not disconnected, so that the thickness of the display panel 10a can be suppressed.

The first plane area 31a and the second plane area 33a are provided in directions away from the curved area 32a and tangential to an arc 40a that is drawn by the curved area 32a when the spacer 12c is viewed in cross-section in the direction of the axis 41a. The arc 40a is an arc about the axis 41a. The first plane area 31a and the second plane area 33a are plane areas extending in the direction of the axis 41a and in the directions tangential to the arc 40a.

The spacer 12c includes a projecting portion 30a that projects in a direction away from the curved area 32a and tangential to the arc 40a. The first plane area 31a and the second plane area 33a are surfaces of the projecting portion 30a. Since the spacer 12c includes the projecting portion 30a, even when the TFT substrate 20a as an insulating substrate has flexibility, the spacer 12a is prevented from rotating inside the bent portion and also the insulating substrate is reinforced.

The projecting portion 30a includes the first plane area 31a extending from one end of the arc 40a in the direction tangential to the arc 40a, and the second plane area 33a extending from the other end of the arc 40a in the direction tangential to the arc 40a. The first plane area 31a is provided at an angle θ of 90 degrees or less with respect to the second plane area 33a. In the spacer 12c according to the embodiment, the first plane area 31a is provided at the angle θ with respect to the second plane area 33a. Here, θ is an angle greater than 0 degrees and less than 90 degrees. In this manner, since the first plane area 31a and the second plane area 33a are provided at an acute angle, a plane area having an area sufficient to support the insulating substrate is provided on the spacer. Moreover, the first flat portion D3 is provided in the TFT substrate 20a due to the first plane area 31a included in the spacer 12c, so that the TFT substrate 20a is firmly supported even if the TFT substrate 20a is flexible.

In the curved area 32a of the spacer 12c according to the embodiment, a groove portion that is provided so as to extend in a direction parallel to the axis 41a or a groove portion that is provided along the arc 40a may be provided.

Third Embodiment

Figure 9:
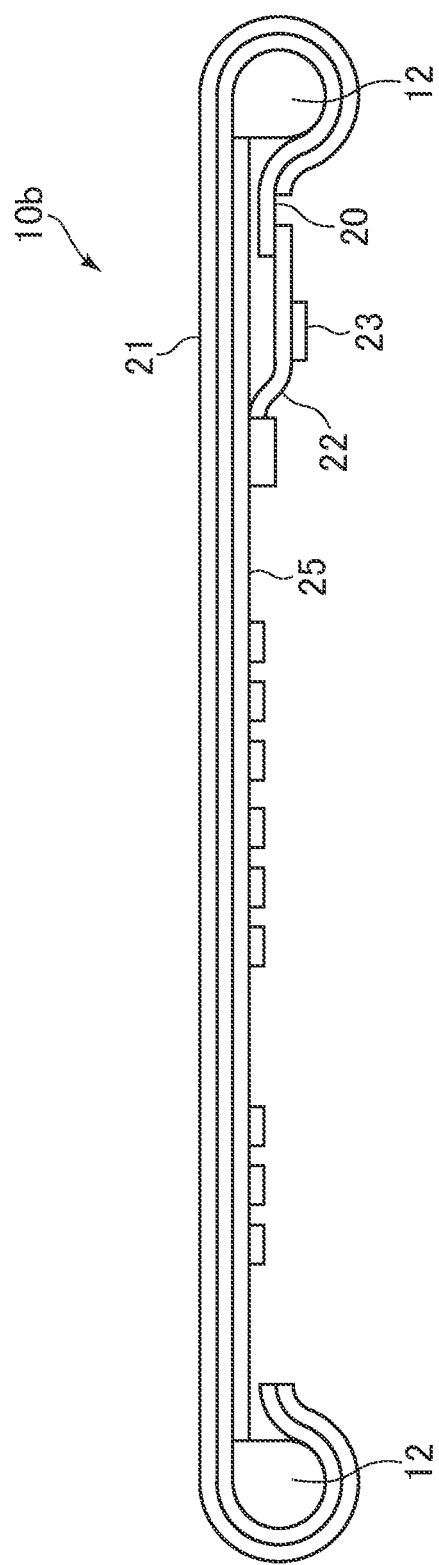
FIG. 9 is a side view of a display panel according to a third embodiment of the invention.

FIG. 9 is a side view of a display panel 10b according to a third embodiment of the invention. The display panel 10b according to the embodiment includes a back plate 25 that is disposed on the side of the display area opposite to the viewing side and at least one edge of which is interposed in the TFT substrate 20 as an insulating substrate. The display panel 10b according to the third embodiment has configurations similar to those of the display panel 10 according to the first embodiment, excepting that the back plate 25 is included.

An electronic component for driving a display device may be mounted on the outer surface of the back plate 25. By mounting the electronic component on the outer surface of the back plate 25, an area of the display area on the side opposite to the viewing side can be utilized.

In the display panel 10b according to the embodiment, even when the TFT substrate 20 and the counter substrate 21 have flexibility, the entire surface of the display area is strongly reinforced by forming the back plate 25 using a highly rigid material such as metal or polycarbonate resin. Moreover, a display device having a curved display area can be realized by molding the back plate 25 into a three-dimensional shape including a curved surface.

All display devices that may be implemented, based on the display device 1 described as the embodiment of the invention, by those skilled in the art through appropriate changes in design also belong to the scope of the invention as long as the display device contains the gist of the invention. For example, the spacer 12 may be formed integrally with the frame 2, and the display panel 10 may be fixed so as to wrap around the spacer 12 formed integrally with the frame 2.

Various altered and modified examples within the range of the idea of the invention will occur to those skilled in the art, and it is understood that the altered and modified examples also belong to the scope of the invention. For example, when those skilled in the art appropriately add or remove a component or change the design of a component in the embodiments described above, or add or omit a process or change the conditions of a process in the embodiments described above, those are included in the scope of the invention as long as they include the gist of the invention.

Moreover, it is understood that as to other operational effects brought about by the aspects described in the embodiments, an operational effect that is apparent from the description of the specification or that will appropriately occur to those skilled in the art is of course brought about by the invention.

While there have been described what are at present considered to be certain embodiments of the invention, it will be understood that various modifications may be made thereto, and it is intended that the appended claim cover all such modifications as fall within the true spirit and scope of the invention.

What is claimed is:

1. A display device comprising:
   a flexible substrate including a first portion, a second portion, and a bent portion between the first portion and the second portion, the bent portion bent at 90 degrees or more;
   a display area on the first portion; and
   a spacer inside the bent portion,
   the spacer comprising:
   a curved portion along an arc with an axis as a center; and
   a projecting portion projecting outward from the arc, and having a first plane portion and a second plane portion, wherein
   the first plane portion extends from one end of the arc in a direction tangential to the arc,
   the second plane portion extends from another end of the arc in a direction tangential to the arc,
   the second plane portion is at an angle of 90 degrees or less with respect to the first plane portion,
   the bent portion is in contact with the curved portion,
   a part of the first portion is in contact with the first plane portion, and
   the first portion and the second portion face each other.

2. The display device according to claim 1, wherein the arc is a part of a circle with a diameter larger than a distance between the first portion and the second portion which face each other.

3. The display device according to claim 1, wherein the spacer has a groove in the curved portion so as to extend in a direction parallel to the axis, and the bent portion and the spacer are bonded with an adhesive member in the groove.

4. The display device according to claim 1, wherein the spacer has a groove in the curved portion so as to extend along the arc, and the bent portion and the spacer are bonded with an adhesive member in the groove.

5. The display device according to claim 1, wherein the bent portion has a bent angle of 180 degrees or more.

6. The display device according to claim 1, wherein the flexible substrate includes a folded-back portion, folded back through the bent portion, on a side opposite to a viewing side of the display area, and the folded-back portion includes the second portion and is bonded, at an inner surface thereof, to the side opposite to the viewing side.

7. The display device according to claim 1, wherein the bent portion includes two bent portions that are arranged so as to hold the first portion therebetween, the second portion includes two second portions that are arranged so as to hold the two bent portions therebetween in a developed view of the flexible substrate, and each of the two bent portions is between the first portion and a corresponding one of the two second portions.

8. The display device according to claim 1, further comprising a flexible printed circuit board, wherein the flexible printed circuit board is mounted on an end part of the flexible substrate.

9. The display device according to claim 6, further comprising a flexible printed circuit board, wherein the flexible printed circuit board is mounted at the folded-back portion.

* * * * *